(12) United States Patent
Hakey et al.

(10) Patent No.: US 6,391,426 B1
(45) Date of Patent: May 21, 2002

(54) HIGH CAPACITANCE STORAGE NODE STRUCTURES

(75) Inventors: Mark C. Hakey; Steven J. Holmes, both of Milton; David V. Horak, Essex Junction, all of VT (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 804 days.

(21) Appl. No.: 08/878,136

(22) Filed: Jun. 19, 1997

Related U.S. Application Data

(60) Division of application No. 08/790,876, filed on Feb. 3, 1997, now Pat. No. 5,776,660, which is a continuation-in-part of application No. 08/715,287, filed on Sep. 19, 1996, now Pat. No. 6,114,082.

(51) Int. Cl.[7] .............................. B32B 1/00; B32B 3/00; G03C 3/00
(52) U.S. Cl. ......................... 428/174; 428/141; 430/11; 430/14
(58) Field of Search .................................. 428/156, 195, 428/174, 141; 216/67; 430/296, 312, 314, 317, 967, 11, 14

(56) References Cited

U.S. PATENT DOCUMENTS 4,671,970 A * 6/1987 Keiser et al. .................. 427/93

* cited by examiner

*Primary Examiner*—Steven H. VerSteeg
(74) *Attorney, Agent, or Firm*—Whitham, Curtis & Christofferson, P.C.; Mark F. Chadurjian

(57) ABSTRACT

A high capacitance storage node structure is created in a substrate by patterning a hybrid resist (12) to produce both negative tone (16) and positive tone (18) areas in the exposed region (14). After removal of the positive tone areas (18), the substrate (12) is etched using the unexposed hybrid resist (12) and negative tone area (16) as a mask. This produces a trench (22) in the substrate (12) with a centrally located, upwardly projecting protrusion (24). The capacitor (26) is then created by coating the sidewalls of the trench (22) and protrusion (24) with dielectric (28) and filling the trench with conductive material (30) such as polysilicon.

5 Claims, 4 Drawing Sheets

HIGH CAPACITANCE STORAGE NODE STRUCTURES

CROSS REFERENCE TO RELATED APPLICATION

This application is a divisional application Ser. No. 08/790,876 filed Feb. 3, 1997, now U.S. Pat. No. 5,776,660 which itself is a continuation-in-part application of U.S. Ser. No. 08/715,287 filed Sep. 19, 1996, now U.S. Pat. No. 6,114,082.

DESCRIPTION

BACKGROUND OF THE INVENTION

1. Field of the Invention

The present invention generally relates to the manufacture of capacitors in silicon substrates and has particular application to the manufacture of dynamic random access memories (DRAMs) in semiconductor devices.

2. Background Description

DRAM semiconductor devices use a capacitor in each memory cell in order to store information. In order to optimize the density and performance of these devices, it is desirable to create as high a capacitance as possible in the smallest area of silicon. Deep trench capacitors and stacked capacitors are two types of capacitor structures which are commonly used in industry. Deep trench capacitors are formed by printing a small opening in a resist using photoresists, lithographic patterning technologies, and etching. Typically, a trench of 5–15 $\mu$m deep is etched into a wafer, chip, or similar substrate using the patterned photoresist as a mask when fabricating deep trench capacitors. The sidewalls of this trench are coated with a dielectric and then filled with polysilicon in order to form the capacitor. Stacked capacitor structures are formed on the surface of the wafer or chip substrate by creating upward-reaching protrusion of a conductive material coated with a dielectric. The upward protrusion is often formed by printing a small space in a resist, etching the space pattern into an underlying dielectric, and then coating the etched opening with polysilicon. The problem with these two approaches is that it is difficult to etch the trench deep enough, or make the protrusions tall enough, to generate a desirable capacitance.

Several methodologies have been developed for increasing capacitance. For example, some methods have used standing waves in the resist pattern to provide additional surface area for the stacked capacitor (see, for example, U.S. Pat. No. 5,556,802 to Wong et al.). Other methods have also been used to increase the surface area of the capacitor (see, for example, Morihara et al., "Disk-Shaped Stacked Capacitor Cell for 256 Mb Dynamic Random Access Memory", *Jap. J. Appl. Phys.*, 33:4570–4575 (August, 1994); Nguyen, S. V. et al., "Novel Fingered Stack Capacitor Cell", *J. Electrochem. Soc.*, 142:L111–L113 (July, 1995); and "Toshiba's New Capacitor Structure for its 1 Gb DRAM Memory Cell", *Microelectronics Journal*, Vol. 27, page vi, March–June, 1996). Techniques have also been developed for the etching of higher aspect ratio structures in substrates. Furthermore, some methodologies have involved the formation of dielectric layers with materials of high dielectric constant. Examples of these techniques and methodologies can be found in Matsuo, N. et al., "Higher-Integrated Spread-type Stacked Capacitor and Its Suitable Arsenic Solid-Diffusion Method", *Microelectronics J.* 27:73–77 (February, 1996); Ohji et al., "$Ta_2O_5$ Capacitor Dielectric Material for Gigabit DRAMs", *Proc. 1995 International,* *Electron Devices Meeting, IEEE*, Piscataway, N.J. 95CH35810, pages 111–114; and Kwon et al., "$Ta_2O_5$ Capacitors for 1 Gbit DRAM and Beyond", *Proc. 1994 IEEE International Electron Devices Meeting,* 94CH35706, pages 835–838.

SUMMARY OF THE INVENTION

It is an object of this invention to provide a simple and effective fabrication method for fabricating high capacitance storage node structures such as DRAMs or the like.

It is another object of this invention to provide a technique for increasing the polysilicon surface in a capacitor structure to substantially increase capacitance, without etching deeper into a wafer or forming taller protrusions;

It is yet another object of this invention to provide novel structures having high capacitance storage nodes.

According to the invention, a hybrid resist is positioned on top of the substrate in which the high capacitance storage node is to be created. The hybrid resist acts as a positive tone at low exposure doses and a negative tone at high exposure doses. When the resist is image-wise exposed with a storage capacitor pattern, the features which normally print as a simple resist opening, actually print as an opening with an island of resist in the center. This is because the resist which forms the center island is exposed to relatively more radiant energy and acts as a negative tone, while the resist surrounding the center island is exposed to relatively less radiant energy and acts as a positive tone. After exposure, the resist in the exposed positive tone region is removed. The pattern is then transferred to the underlying substrate by etching the substrate using the resist as a mask. This creates a center protrusion within the etched trench which underlies the center island negative tone resist. This protrusion provides additional surface area within the capacitor which provides an approximately 2× increase in capacitance in a fully fabricated DRAM capacitor. The process is useful in fabricating both deep trench capacitors and stacked capacitors. It is simpler to perform than processes which require multiple deposition and etch processes. Furthermore, the process can be used in conjunction with other capacitance enhancing techniques such as higher aspect ratio structures, use of higher dielectric constant insulating materials, and use of standing waves in the resist pattern.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1A:
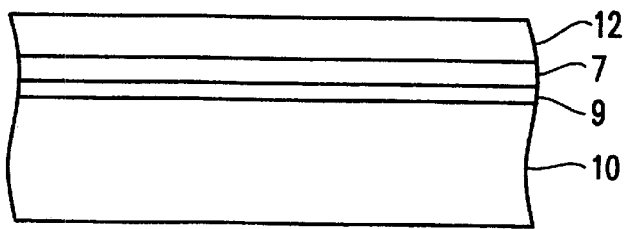
FIGS. 1a–e are sequential, cross-sectional schematic drawings of a substrate illustrating the inventive fabrication process for forming a high capacitance storage node structure in the substrate.

FIGS. 1a–e illustrate one example of the fabrication process where a deep trench storage capacitor for a DRAM is formed in a silicon substrate 10. However, as will be discussed in conjunction with FIG. 5, the process can also be used for forming stacked capacitors. While the substrate 10 is preferably silicon, and is most preferably a wafer or chip, it should be understood by those of skill in the art that the process can be used with other substrates such as germanium or the like. Furthermore, this invention contemplates the formation of high capacitance storage node structures in a general sense, and is not limited in its application to DRAMs or the like.

A hybrid resist material 12 is coated on the substrate 10 by spraying, dipping, physical or chemical deposition, or other suitable technique. Interposed between the hybrid resist 12 and substrate, layers of a hard mask 7, such as chemical vapor deposited $SiO_2$, and a polish stop 9, such as silicon nitride. Optionally, another layer (not shown), such as $SiO_2$, can be positioned on top of the substrate 10 before any layers are deposited. The hard mask 7 and polish stop 9 will be patterned using the patterned hybrid resist 12, as shown in FIG. 1d, and serve the purpose of assisting in deep trench formation in the substrate 10 during RIE.

A hybrid resist material 12 is one in which a difference in radiant energy exposure changes the tone of the resist. That is, the hybrid resist 12 has both a positive tone and a negative tone depending on exposure. Suitable hybrid resists can be formulated using components of existing positive and negative tone resists. This includes, for example, poly(hydroxystyrene) resins which are partially modified with acid-sensitive solubility dissolution inhibiting functionalities, a cross-linker, a photo-acid generator, and, optionally, a base additive and a photosensitizer. The hybrid resist formulations may be varied to obtain a fast positive tone reaction and a slow negative tone reaction. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results. In addition, the resist formulations may be altered to provide space widths of different dimensions. For example, as the amount of solubility inhibitor on the poly(hydroxystyrene) resin is increased, the printed space width becomes smaller. This approach may also be used to alter the isofocal print bias of the negative tone line 16. For example, at higher positive tone solubility inhibitor concentrations, the isofocal print bias of the negative tone line 16 increases. The relative responses of the positive and negative tone functions of the hybrid resist 12 can also be altered by modifying the exposure conditions. For example, the negative tone line of the hybrid resist can vary with exposure dose and reticle dimension, similar to the behavior of a conventional resist. Thus, as exposure dose is increased, the negative tone area 16 increases in width, and the positive tone areas 18 remain the same size, but are shifted to a new position on the substrate since they lie adjacent the negative line 16. Similarly, the positive tone areas 18 alter in size as the exposure dose or reticle dimension are altered.

Examples of hybrid resists suitable for use in this invention include any of the base-soluble, long chain polymers suitable for use as a polymer resin in a photoresist formulation. Specific examples include aromatic polymers having an hydroxy group, e.g., polyhydroxystyrenes such as poly(4-hydroxystyrene), poly(3-hydroxystyrene), which are commercially available from Hoechst Celanese of Corpus Christi, Tex., novalak resins available from Shipley of Marlboro, Mass., and polymers having a phenolic hydroxy group, e.g., polymethacrylic resins; polymers having an acid group, e.g., polymethacrylic acid with an ester side chain; and acrylamide group type polymers. The polymer resin in its deprotected form wherein the positive tone reaction has occurred is base soluble and compatible with developer solutions. Preferred polymer resins have an average molecular weight within the range of about 1,000 Daltons to about 250,000 Daltons, and most preferably within the range of about 1,000–25,000 Daltons to enhance its solubility in developer solutions. Examples include p-hydroxystyrene-maleic acid anhydride copolymers, polyhydroxystyrene-petertiarybutyl-carganatostyrene copolymers, poly(2-hydroxystyrene), phenol formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially avialable from Maruzen America of New York, N.Y. The PHM-C includes both poly(hydroxystyrene) subunits and vinyl cyclohexanol subunits preferably being in the range of about 99:1 to about 50:50. The most preferred ratio is about 90 poly(hydroxystyrene) units to about 10 vinyl cyclohexanol subunits.

Crosslinking compositions are preferably tetramethoxymethyl glycourils ("powderlink") and 2,6-bis(hydroxymethyl)-p-cresol. However, other possible crosslinking compositions include those found in Japanese Laid-Open Patent Application (Kokai) No. 1-293339, as well as etherified amino resins, for example methylated or butylated melamine resins (N-methoxymethyl- or N-butoxymethyl-melamine, respectively) or methylated or butylated glycol-urils, as can be found in Canadian Patent No. 1,204,547.

Photoacid generators include, but are not limited to N-(trifluoro methylsulfonyloxy)-bicyclo[2.2.1]hept-5-ene-2,3-dicarboximide ("MDT"), onium salts, aromatic diazonium salts, sulfonium salts, diaryliodinium salts and sulfonic acid esters of N-hydroxyamides or imides as disclosed in U.S. Pat. No. 4,731,605, which is herein incorporated by reference. Also, a photoacid generator that produces a weaker acid such as dodecane sulfonate or N-hydroxynaphthalimide may be used.

Possible base additives include but are not limited to dimethylamino pyridine, 7-diethylamino-4-methyl coumarin ("Coumarin 1"), tertiary amines, proton sponge, berberine, and polymeric amines as in the "Pluronic or "Tetronic" series from BASF. Additionally, tetra alkyl ammonium hydroxides or cetyltrimethyl ammonium hydroxide, may be used when the photoacid generator is an onium salt.

Examples of sensitizers that may be utilized include chrysens, pyrenes, fluoranthenes, anthrones, benzophenones, thioxanthones, and anthracenes, such as 9-anthracene methanol. Additional anthracene derivative sensitizers are disclosed in U.S. Pat. No. 4,371,605 which is incorporated by reference. The sensitizer may include oxygen or sulfur. The preferred sensitizers will be nitrogen free because the presence of nitrogen, e.g., an amine or phenothiazine group tends to sequester the free acid generated during the exposure process and the formulation will lose photosensitivity.

The casting solvent is used to provide proper consistency to the entire composition so that it may be applied to the substrate surface without the layer being too thick or too thin. Example casting solvents include ethoxyethylpropionate (EEP), combinations of EEP and γ-butyrolactone (GBL), and propyleneglycolmonoethylether acetate (PM acetate).

The following examples provide synthesis procedures for a few of the many compositions which can be used as the hybrid resist 12; however, it should be understood that the principal feature is that the hybrid resist 12 is comprised of a negative tone component and a positive tone component, wherein the positive tone component acts at a first actinic energy level and the negative tone component acts at a second actinic acid energy level:

EXAMPLE 1

The following compositions were dissolved in PM acetate containing 350 ppm of FC-430, a non-ionic fluorinated alkyl ester surfactant available from 3M, of St. Paul, Minn., for a total of 20% solids:

poly(hydroxystyrene) (PHS), 10% hydrogenated, available from Maruzen America with about 25% of the phenol groups protected with methoxypropene (MOP), 81.2% of solids;

N-(trifluoromethylsulfonyloxy)-bicyclo-[2.2.1]-hept-5-ene-2,3-dicarboximide, available from Daychem Labs, of Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from Aldrich Chemical Company, 0.1% of solids. The solutions was filtered through a 0.2 $\mu$m filter. The solution was coated onto silicon wafers primed with hexamethyl-disilazane with a soft bake of 110° C. resulting in films of about 0.8 $\mu$m thick as determined by a Nanospec reflectance spectrophotometer. The coated wafers were then exposed with deep ultraviolet (DUV) excimer laser radiation having a wavelength of 248 nm in a 0.37 numerical aperture Canon stepper with a matrix of different doses from low doses to high doses and post expose baked at 110° C. for 90 seconds. The dissolution rates of the exposed films were calculated from the thickness of remaining film after developing for a given amount of time with 0.14 N TMAH developer. The dissolution rate was very low (about 2 nm/sec) when unexposed. As the dose is increased, the dissolution rate increases until reaching 50 nm/sec. The dissolution rate remains relatively constant at this level in the dose range of about 1 milliJoule (mJ) to about 3 mJ. Increasing the dose further, the negative crosslinking chemistry becomes predominant, and the dissolution rate falls back to a value close to zero.

In a typical lithographic response test, the resist was exposed through a mask having 1 $\mu$m wide nested chrome lines at a pitch of 2 $\mu$m with a 248 nm DUV stepper with a 0.37 numerical aperture. Every chrome line and space combination in the mask prints as two lines and two spaces on the resist: a negative line of about 0.8 $\mu$m, a positive tone line of about 0.6 $\mu$m and two equal spaces of about 0.3 $\mu$m. In another experiment with the same resist, when a Micrascan II 0.5 numerical aperture DUV stepper is used to expose an isolated chrome space onto the hybrid resist film, the space/line/space measurements as a function of width were plotted, and it was shown that although the width of the line increases correspondingly with that of the chrome space on the mask, the space on either side of the line remains relatively constant.

EXAMPLE 2

A hybrid resist was prepared and processed in the same manner as in Example 1, however it comprised the following components:

PHS with about 25% of the phenol groups protected with MOP, 90.8% of solids;

triphenyl sulfonium triflate, 1.3% of solids;

Powderlink, 7.8% of solids;

TMAH base, 0.1% of solids; and sufficient PM acetate containing 350 ppm FC-430 surfactant as a solvent to form a 18.9% solids solution.

The dissolution rate characteristics of the resulting resist were similar to that of Example 1 in that the dissolution rate starts out low, for an unexposed resist, increases to a high at about 5 mJ and decreases to a low above 7 mJ. However, the absolute dose range and the dissolution rates within these ranges were different. When this hybrid resist was exposed through a mask of nested chrome lines and spaces of equal widths in a Micrascan II 0.5 numerical aperture stepper tool, and negative line, unexposed line, and space widths were plotted as a function of mask dimension, the space remains relatively constant in the range of about 0.18 $\mu$m, whereas both lines vary as the mask dimension is varied.

This hybrid resist formulation was image-wise exposed with a chrome retical with an electrical test pattern of a 0.5 numerical aperture DUV expose system. Silicon wafers (200 mm) with a 2000 Å film of polysilicon were used as a substrate so that the resulting etched patterns of the resist image could be measured with electrical probe techniques. After the post expose bake process, the wafers were cycled back into the expose tool and exposed at 10 mJ per square centimeter with a clear glass reticle. A post expose bake process was not performed after the second exposure. The purpose of the second exposure was to remove the initially unexposed resist from the wafer, leaving only a negative tone resist pattern after develop. The initial image-wise expose dose was 17–24 mJ/cm$^2$, the post expose bake temperature was 100° C. for 90 seconds and the develop time was 100 seconds in 0.14 N TMAH. A standard negative tone resist was processed in a similar fashion as a control, with the omission of a blanket expose step. A large isofocal print bias of approximately 0.11 $\mu$m was observed for the hybrid resist relative to the standard negative resist.

EXAMPLE 3

Two different PHS lots having 24% and 15% MOP loading, respectively, were used to make hybrid formulations identical to that of Example 1, except that the total solids content were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a Micrascan II DUV 0.5 numerical aperture stepper, post exposed baked at 110° C. for 60 seconds, and finally developed with 0.14 N TMAH developer. A reticle with an isolated chrome opening was printed in a hybrid resist film, and the spacewidth of the resist image was measured and plotted as a function of the average MOP solubility inhibitor loading in the PHS used for making the respective formulations, and it was found that the space width was strongly dependent on the MOP concentration.

Figure 1B:
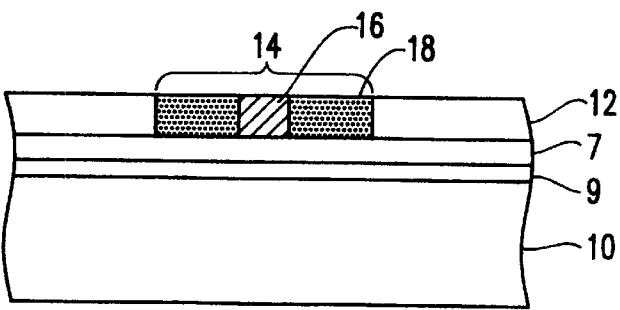

Referring back to the drawing figures, as shown in FIG. 1b, relatively high radiant energy exposure doses convert the hybrid resist 12 to a negative tone 16 where material that is exposed to the high radiant energy becomes hard and less soluble than surrounding material that is not exposed to the high radiant energy, and relatively low radiant energy doses convert the hybrid resist 12 to a positive tone 18 where material that is exposed to the low radiant energy doses becomes more soluble than surrounding material. For the hybrid resists described above doses of 15–25 mJ should be sufficient for a negative tone, while doses of 5–10 mJ should be sufficient for a positive tone. However, these values can vary from one stepper to another, as the calibration systems for a mJ are not identical. The above values should be understood to be rough approximate values because the negative tone and positive tone are not exposed with separate exposure doses. Rather, the two features are formed simultaneously using the natural diffraction or beam intensity variation to cause the positive space to print adjacent to the negative line. The relative exposure energies can be determined by using a dose matrix with a large open field, and measuring the dose at which the positive tone clears and the negative tone gels. A typical imaging dose is about 2× these large open field expose doses, for optical systems, due to the diffraction effects. FIG. 1b shows that a pattern is created in the hybrid resist 12 by exposing a region 14 to low doses of radiation and high doses of radiation to form a negative tone resist area 16 surrounded by a positive tone resist area 18. The hybrid resist 12 is image-wise exposed with actinic radiation. The radiation can be optical, such as I-line (365 nm) or deep ultraviolet (DUV)(2405–250 nm) regions of a mercury lamp, excimer laser at 248 nm, electron-beam (E-beam), X-ray, Ion beam, etc. Usually, a mask is used to form the image on the substrate, but direct write methods, such as I-line laser or E-beam, can also be used. The hybrid image defined as region 14 is formed as a result of the variation in actinic radiation intensity at the edge of the exposed pattern.

In an optical expose system that uses a mask, diffraction effects cause the aerial image to become diffuse, with low intensity near the edges of clear areas in the mask, increasing to the highest expose values at the center of the clear images on the reticle. When a hybrid resist is exposed to such an aerial image, the positive tone function is triggered at the low expose regions at the edge of the image. In the center of the image, high expose energies cause the negative tone response of the hybrid resist to be expressed. In this way, a positive tone space and a negative tone line can be printed in close proximity.

In X-ray applications, the gap setting between the mask and the substrate determine the degree of variation in expose energy from the edge of the image to the center of the clear pattern. In direct-write laser and E-beam processing, the energy variation from the edge to the center of the expose beam is used to selectively trigger a positive response at the edge of the beam, and a negative response at the center of the expose beam.

The spacewidth of the hybrid pattern is generally insensitive to the width of the mask opening and the expose dose, while the linewidth of the hybrid pattern varies with mask dimension and expose dose similar to a conventional resist. For an I-line expose (365 nm line from mercury lamp), spacewidths of 0.18 $\mu$m to 0.5 $\mu$m have been achieved. For a DUV expose system, spacewidths of 0.12–0.25 $\mu$m have been readily achieved. For an E-beam expose system, spacewidths of 0.07 $\mu$m have been achieved. In general, a sharper transition from "dark" to "bright" expose areas will produce a smaller spacewidth. The spacewidth can also be altered by modifying the formulation of the resist, creating much larger spaces than described above.

Figure 1C:
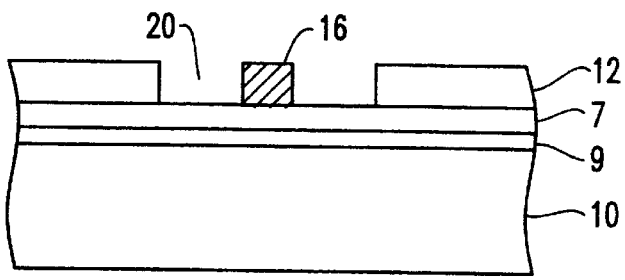
Figure 1D:
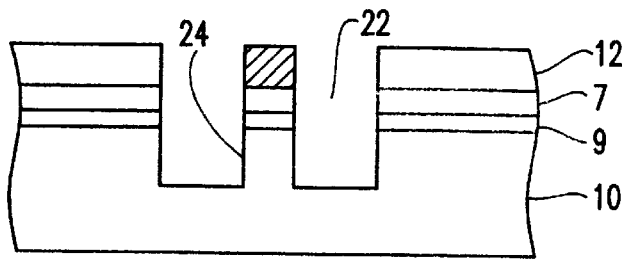

FIG. 1c shows openings 20 in the hybrid resist 12 which surround the negative tone area 16. These openings 20 are created by removing the positive tone areas 18 of the exposed region 14 of the hybrid resist using a solvent or "developer", such as aqueous tetramethylammonium hydroxide (TMAH (0.14N–0.26N)), metal free ammonium hydroxide, metal containing potassium hydroxide, and sodium metasilicate. Development can usually be achieved in 50–130 seconds depending on the formulation of the hybrid resist, and the resist thickness.

FIG. 1d shows the pattern of openings in the hybrid resist 12 is transferred into the substrate 10 by etching or other suitable methods. Reactive ion etching (RIE) or chemical etching or other methods which are anisotropic can be used within the practice of this invention. The unexposed regions of the hybrid resist 12, as well as the negative tone area 16 serve as a mask during the etching process. The etching process creates a trench 22 with an upward projecting protrusion 24 in the substrate 10. With reference to FIGS. 1c and 1d, the trench 22 is created at the openings 20 in the hybrid resist 12, and the protrusion is created under the negative tone area 16 of the hybrid resist. The protrusion 16 extends above the bottom of the trench 22 and provides additional silicon surface area that will be used as part of the capacitor. The higher silicon surface area provides approximately a 2× increase in capacitance in a fully fabricated DRAM capacitor.

Figure 1E:
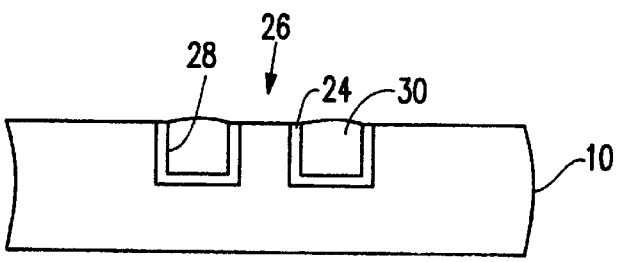

FIG. 1e shows the high capacitance storage node structure 26 in substrate 10 is finished by depositing or growing a dielectric 28 such as silicon dioxide, silicon nitride, silicon oxynitride, or tantalum oxide in the trench 22 to coat the sidewalls of the trench and the sidewalls of the protrusion 24, and then filling the remainder of the trench with a conductor material 30 such as doped polysilicon. The unexposed regions of the hybrid resist 12 and the negative tone resist area 16 are preferably removed from the substrate 10, and this can be accomplished by a variety of techniques including using oxygen plasma or ozone plasma to strip the resist, or using strong oxidizing acid solutions, such as sulfuric/peroxide. The capacitor is comprised of the conductor material 30 forming one conductive element, the silicon 10 forming the other conductive element, and the dielectric 28 positioned between the two conductive elements.

Figure 2:
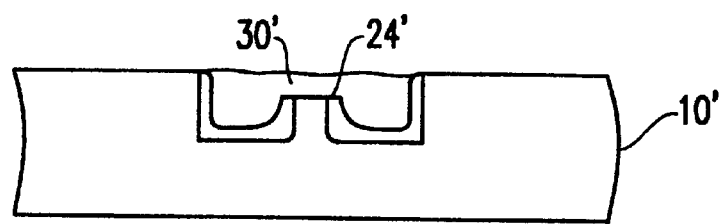
FIG. 2 is a cross-sectional side view of a substrate with a high capacitance storage node according to this invention.

FIG. 2 shows a variation of the high capacitance storage node device of FIG. 1e wherein the protrusion 24' is shorter than the sidewalls of the trench in the substrate 10', and the conductor material 30' fills the entire trench including over the top of the protrusion 24'. This structure would result if the etch rate of the negative tone resist area were faster than the unexposed region of the hybrid resist, or if some undercutting occurred under the negative tone area. The relatively smaller protrusion 24' may occur accidentally or be intentionally designed into the capacitor. In either case, the protrusion 24' still provides additional surface area for the capacitor and thereby increases the relative capacitance.

Figure 3:
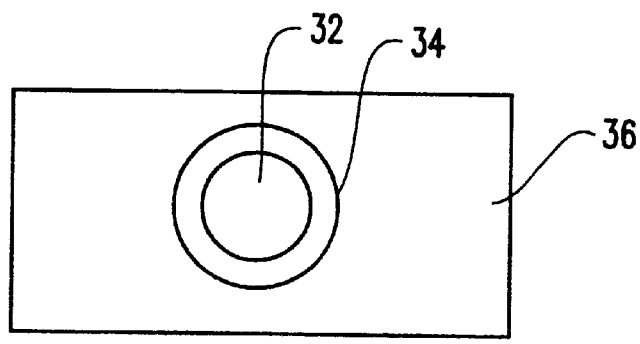
FIG. 3 is a top view of one embodiment of a substrate with a high capacitance storage node according to this invention.
Figure 4:
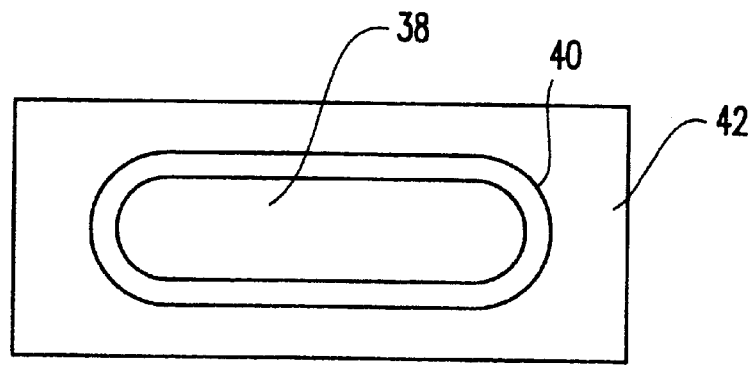
FIG. 4 is a top view of another embodiment of a substrate with a high capacitance storage node according to this invention.

FIGS. 3 and 4 show examples of various capacitors with different trench designs according to this invention. FIG. 3 shows a silicon island 32 surrounded by polysilicon 34 in substrate 36, where the polysilicon 34 fills a circular trench in the substrate 36. FIG. 4 shows an oblong silicon island 38 surrounded by polysilicon 40 in substrate 42. These patterns are created by exposing a hybrid resist to actinic radiation (I-line, DUV, E-Beam, X-ray, etc.), either with an appropriate mask pattern or with direct write. A suitable expose dose is used to cause both the positive and negative components of the hybrid resist to be expressed. The substrate is baked after exposure to cause a chemical amplification reaction to occur in the exposed regions, and is developed. Typical bake conditions are 90–115° C. for 60–120 seconds. In both cases, a capacitor is created where the polysilicon 34 or 42 forms one plate, and the silicon in both the substrate 36 or 40 and the island 32 or 38 form the other plate of the capacitor. A dielectric, not shown, but best illustrated in FIG. 1e, is positioned between the two plates of the capacitor.

FIGS. 5a–d show a variation on the inventive fabrication process wherein a stacked capacitor is created on a substrate 50. A dielectric 52, such as $SiO_2$ deposited using tetraethylorthosilicate (TEOS) or other suitable dielectric materials, is deposited on the substrate 50 and is patterned and filled with a cap stud conductor 54 which extends to the substrate 50. An etch barrier layer 56 is then deposited over the dielectric 52 and cap stud conductor 54. Chemical vapor deposited nitride films could be useful as the etch barrier layer 56.

On top of the etch barrier layer, a "place holder" layer 58 is deposited. The "place holder" layer is a sacrificial layer which is used for fabrication of a doughnut shaped conductor and fixes the conductor in place during fabrication. A suitable "place holder" layer 58 may be CVD TEOS ($SiO_2$).

Figure 5A:
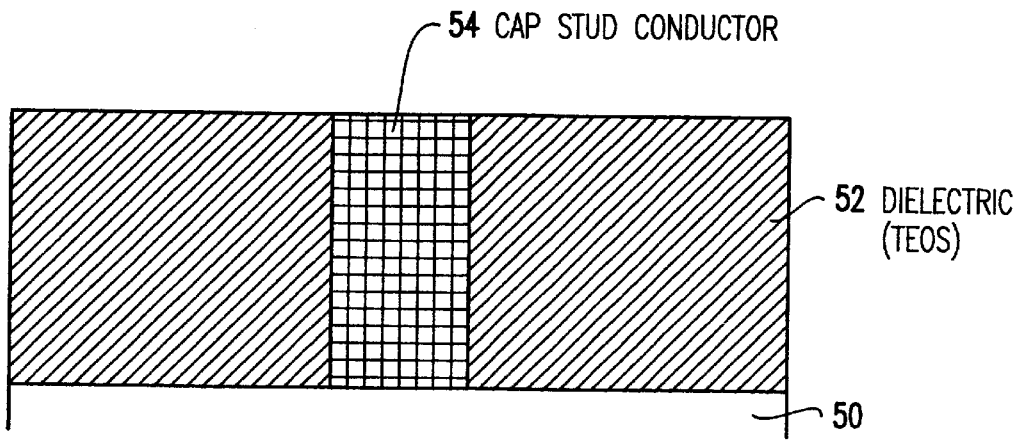
FIGS. 5a–d are sequential cross-sectional side views illustrating the fabrication of a stacked capacitor.
Figure 5B:
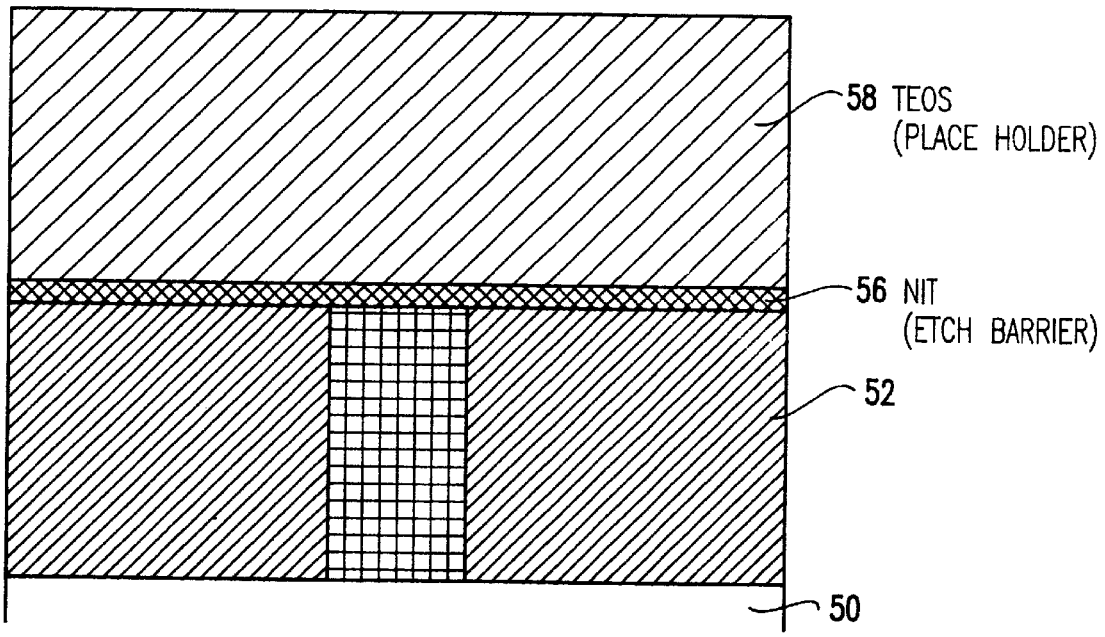
Figure 5C:
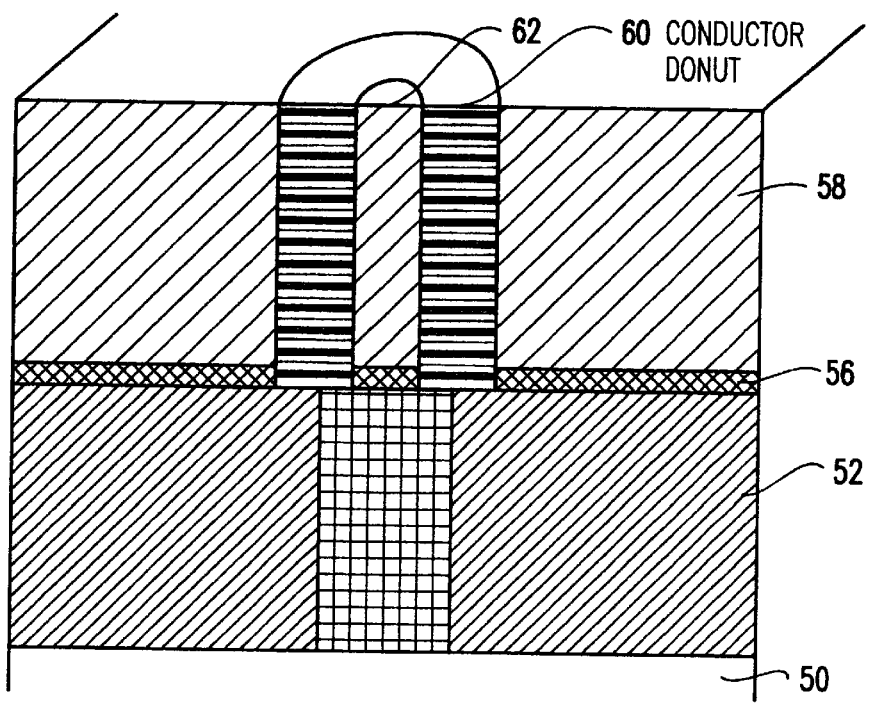
Figure 5D:
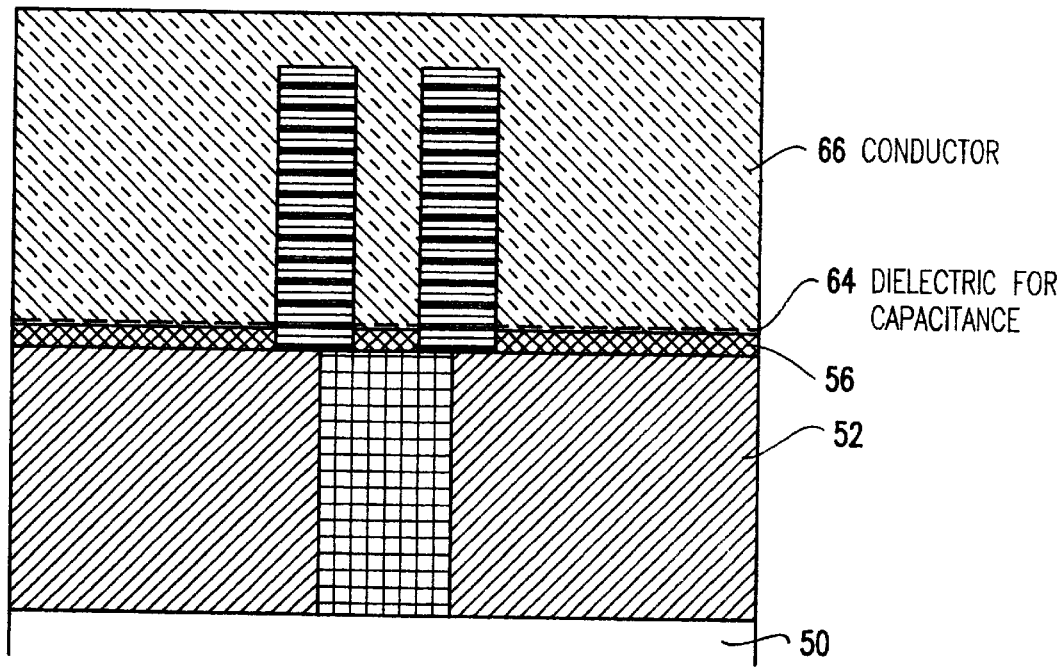

Contrasting FIGS. 5b and 5c, it can be seen that doughnut shaped conductor 60 is positioned in the "place holder" layer 58. This is accomplished using the inventive process described above in connection with FIGS. 1a–d. That is, a hybrid resist (not shown) is coated on the structure; it is exposed and developed to produce a layer of unexposed material, exposed positive tone material, and exposed negative material; and the "place holder" layer 58 is etched to produce a doughnut shaped well having a central mandrel 62. Subsequent to these processes, a conductor is deposited to fill the etched well in the "place holder" layer 58, thus providing a doughnut shaped conductor 60. Any extraneous conductor on the "place holder" layer 58 surface can be removed by polishing or other processes.

After fabrication of the doughnut shaped conductor 60, the "place holder" layer is removed from the structure by etching or other suitable means. Etching would stop on the etch stop barrier 56, and would remove the "place holder" layer 58 outside the doughnut shaped conductor 60 as well as the centrally located mandrel 62. Then, a dielectric layer 64 (e.g., Barium-Strontium-Titanate (BSTO), $Ta_2O_5$, $SiO_2$) is added over the doughnut shaped conductor 60 and etch stop barrier 56 for capacitance by CVD or other suitable means, and the entire structure is overcoated with a second conductor 66 which serves as the second plate of the capacitor (the doughnut shaped conductor 60 serving as the first plate).

While the invention has been described in terms of its preferred embodiments, those skilled in the art will recognize that the invention can be practiced with modification within the spirit and scope of the appended claims.

We claim:

1. A substrate with a high capacitance storage node, comprising:

a trench formed in a substrate having sidewalls and a bottom;

a projection of said substrate centrally positioned within said trench projecting above said bottom of said trench;

a dielectric material coated on said sidewalls and bottom of said trench and on said projection of said substrate within said trench; and a conductive material filling said trench on top of said dielectric material.

2. The substrate of claim 1 wherein said conductive material is polysilicon.

3. The substrate of claim 1 wherein said dielectric is selected from the group consisting of silicon dioxide, silicon nitride, silicon oxynitride, and tantalum oxide.

4. A substrate with a high capacitance storage node, comprising:

a trench formed in a dielectric material positioned on a substrate, said trench having sidewalls and a bottom;

a projection of said dielectric material centrally positioned within said trench projecting above said bottom of said trench; and a conductive material filling said trench.

5. A substrate as recited in claim 4 wherein said conductive material is polysilicon.

* * * * *